United States Patent
Lu et al.

(10) Patent No.: US 12,082,392 B2
(45) Date of Patent: Sep. 3, 2024

(54) SEMICONDUCTOR STRUCTURE AND METHOD FOR PREPARING SEMINCONDUCTOR STRUCTURE

(71) Applicant: CHANGXIN MEMORY TECHNOLOGIES, INC., Hefei (CN)

(72) Inventors: Jingwen Lu, Hefei (CN); Bingyu Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 460 days.

(21) Appl. No.: 17/444,670

(22) Filed: Aug. 8, 2021

(65) Prior Publication Data
US 2022/0068928 A1 Mar. 3, 2022

Related U.S. Application Data

(63) Continuation of application No. PCT/CN2021/099889, filed on Jun. 12, 2021.

(30) Foreign Application Priority Data

Aug. 27, 2020 (CN) .......................... 202010876670.5

(51) Int. Cl.
*H10B 12/00* (2023.01)
*H01L 23/528* (2006.01)

(52) U.S. Cl.
CPC ........... *H10B 12/03* (2023.02); *H01L 23/528* (2013.01)

(58) Field of Classification Search
CPC ...... H10B 12/03; H10B 12/30; H10B 12/482; H01L 23/528; H01L 21/76885; H01L 21/76897; H01L 21/7685; H01L 23/53266; H01L 21/76847
See application file for complete search history.

(56) References Cited

U.S. PATENT DOCUMENTS

| | | | |
|---|---|---|---|
| 4,606,936 A | * | 8/1986 | Bajor ............... H01L 21/0217 438/436 |
| 6,646,285 B1 | | 11/2003 | Kagan |
| 7,151,275 B2 | | 12/2006 | Klauk |
| 7,410,825 B2 | | 8/2008 | Majumdar |
| 8,263,488 B2 | | 9/2012 | Viel |
| 2006/0141156 A1 | | 6/2006 | Viel |
| 2007/0059901 A1 | | 3/2007 | Majumdar |
| 2009/0056991 A1 | | 3/2009 | Kuhr |
| 2010/0314611 A1 | | 12/2010 | Murata |

FOREIGN PATENT DOCUMENTS

| | | |
|---|---|---|
| CN | 1809652 A | 7/2006 |
| CN | 101842856 A | 9/2010 |
| CN | 107910328 A | 4/2018 |
| CN | 210272309 U | 4/2020 |
| IN | 106128998 A | 11/2016 |

* cited by examiner

*Primary Examiner* — Thanh Y. Tran
(74) *Attorney, Agent, or Firm* — Syncoda LLC; Feng Ma

(57) ABSTRACT

A semiconductor structure includes a conductive structure. A method for preparing the conductive structure includes: forming a semiconductor conductive layer; forming a nitrile or isonitrile transition layer on the semiconductor conductive layer; and forming a metal conductive layer on the nitrile or isonitrile transition layer.

20 Claims, 15 Drawing Sheets

ABSTRACT

SEMICONDUCTOR STRUCTURE AND METHOD FOR PREPARING SEMINCONDUCTOR STRUCTURE

CROSS-REFERENCE TO RELATED APPLICATIONS

This is a continuation of International Patent Application No. PCT/CN2021/099889 filed on Jun. 12, 2021, which claims priority to the Chinese Patent Application No. 202010876670.5 filed on Aug. 27, 2020. The disclosures of these applications are hereby incorporated by reference in their entirety.

BACKGROUND

A Dynamic Random Access Memory (DRAM) is a semiconductor memory device commonly used in a computer. A memory array area of DRAM consists of many repeated memory cells. Each memory cell usually includes a capacitor and a transistor. A gate of the transistor is connected to a word line structure. One of a drain or source of the transistor is connected to a bit line structure, and one of the drain or source of the transistor is connected to the capacitor. A voltage signal on the word line structure can control the turn-on or turn-off of the transistor, and then the data information stored in the capacitor is read on the bit line structure, or the data information is written into the capacitor for storage on the bit line structure.

SUMMARY

The present disclosure relates generally to the field of semiconductor manufacturing, and more specifically to a semiconductor structure and a method for preparing the semiconductor structure.

An embodiment of the present disclosure provides a semiconductor structure and a method for preparing the semiconductor structure, so that the contact resistance between a semiconductor conductive layer and a metal conductive layer may be reduced, and the conductivity of the semiconductor structure may be improved.

An embodiment of the present disclosure provides a method for preparing a semiconductor structure. The semiconductor structure includes a conductive structure. The method for preparing the conductive structure includes the following operations. A semiconductor conductive layer is formed. A nitrile or isonitrile transition layer is formed on the semiconductor conductive layer. And a metal conductive layer is formed on the nitrile or isonitrile transition layer.

In some embodiments of the present disclosure, the method further includes the following operation. After the metal conductive layer is formed on the nitrile or isonitrile transition layer, a passivation layer is formed on the metal conductive layer.

In some embodiments of the present disclosure, the semiconductor conductive layer is formed on a semiconductor substrate. The method further includes the following operation. After the passivation layer is formed on the metal conductive layer, the passivation layer, the metal conductive layer, the nitrile or isonitrile transition layer and the semiconductor conductive layer are patterned to form a plurality of bit line structures discretely arranged on the semiconductor substrate.

In some embodiments of the present disclosure, the method further includes the following operation. A protective layer is formed on a sidewall of each bit line structure.

In some embodiments of the present disclosure, the operation that the semiconductor conductive layer is formed includes the following operation. A semiconductor base is provided, which is provided with a plurality of capacitor contact holes.

The semiconductor conductive layer is formed in each capacitor contact hole.

In some embodiments of the present disclosure, the operation that the nitrile or isonitrile transition layer is formed on the semiconductor conductive layer includes the following operation. A surface of the semiconductor conductive layer is treated with a nitrile or isonitrile organic solution to form the nitrile or isonitrile transition layer.

In some embodiments of the present disclosure, a concentration of nitrile or isonitrile in the nitrile or isonitrile organic solution is 5%-10%.

In some embodiments of the present disclosure, after the operation that the nitrile or isonitrile transition layer is formed on the semiconductor conductive layer, the method further includes a rinsing operation.

In some embodiments of the present disclosure, the semiconductor conductive layer is a polysilicon layer, and the metal conductive layer includes a Ti and TiN composite layer and a metal tungsten layer which are sequentially formed.

In some embodiments of the present disclosure, after the Ti and TiN composite layer is formed and before the metal tungsten layer is formed, the method further includes a rapid thermal processing operation.

An embodiment of the present disclosure further provides a semiconductor structure, including a conductive structure. The conductive structure includes a semiconductor conductive layer, a nitrile or isonitrile transition layer and a metal conductive layer which are sequentially stacked on one another.

In some embodiments of the present disclosure, the semiconductor structure further includes a semiconductor base. The semiconductor base includes a semiconductor substrate and a plurality of bit line structures discretely arranged on the semiconductor substrate. A plurality of isolation structures are arranged along a direction perpendicular to the bit line structures, and the isolation structures and the bit line structures form a plurality of capacitor contact holes.

In some embodiments of the present disclosure, each bit line structure includes the conductive structure and a passivation layer covering the conductive structure.

In some embodiments of the present disclosure, a protective layer is formed on a sidewall of each bit line structure.

In some embodiments of the present disclosure, the conductive structure is provided in each of the capacitor contact holes.

DETAILED DESCRIPTION

A conductive connection method between the bit line structure and the drain or source of the transistor of DRAM, or between the capacitor and the drain or source of the transistor of DRAM is a polysilicon-metal plug connection. When the DRAM process shrinks, the size of the polysilicon-metal plug also shrinks accordingly, and then the contact resistance between the polysilicon and the metal becomes an important factor affecting the electrical performance of the semiconductor structure.

A semiconductor structure and a method for preparing the semiconductor structure provided in embodiments of the present disclosure will be described in detail below in combination with the accompanying drawings. The semiconductor structure includes a conductive structure. The conductive structure is composed of a semiconductor conductive layer, a nitrile or isonitrile transition layer and a metal conductive layer.

Figure 1:
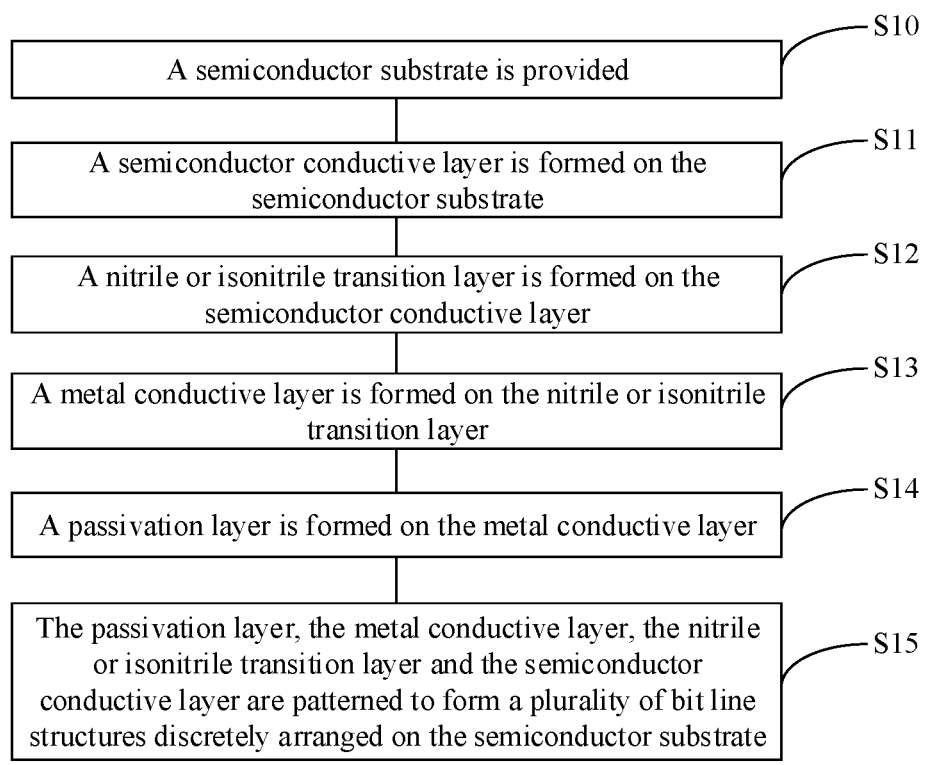
FIG. 1 is a schematic diagram of operations of an embodiment of a method for preparing a semiconductor structure according to an embodiment of the present disclosure.

FIG. 1 is a schematic diagram of operations of an embodiment of a method for preparing a semiconductor structure according to an embodiment of the present disclosure. Referring to FIG. 1, the method includes the following operations. In S10, a semiconductor substrate is provided. In S11, a semiconductor conductive layer is formed on the semiconductor substrate. In S12, a nitrile or isonitrile transition layer is formed on the semiconductor conductive layer. In S13, a metal conductive layer is formed on the nitrile or isonitrile transition layer. In S14, a passivation layer is formed on the metal conductive layer. In S15, the passivation layer, the metal conductive layer, the nitrile or isonitrile transition layer and the semiconductor conductive layer are patterned to form a plurality of bit line structures discretely arranged on the semiconductor substrate.

FIGS. 2-9 are process flow charts of an embodiment of a method for preparing a semiconductor structure according to an embodiment of the present disclosure.

Figure 2:
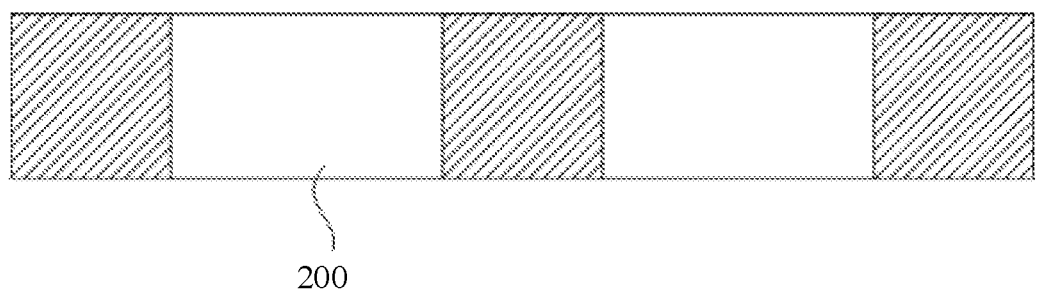
FIG. 2 is a first process flow diagram of an embodiment of a method for preparing a semiconductor structure according to an embodiment of the present disclosure.

Referring to S10 and FIG. 2, a semiconductor substrate 200 is provided.

The semiconductor substrate 200 may be at least one of the following materials: silicon (Si), germanium (Ge), silicon germanium alloy (SiGe), silicon carbide (SiC), silicon germanium carbon alloy (SiGeC), indium arsenide (InAs), gallium arsenide (GaAs), indium phosphide (InP) or other III/V compound semiconductors, and further includes a multilayer structure composed of these semiconductors, or may be a Silicon On Insulator (SOI), a Stack-Silicon On Insulator (S—SOI), a Stack-Silicon Germanium On Insulator (S—SiGeOI), a Silicon Germanium on Insulator (SiGeOI), a Germanium On Insulator (GeOI), and the like. As an example, in the embodiment of the present disclosure, the material of the semiconductor substrate 200 is single crystal silicon.

Figure 3:
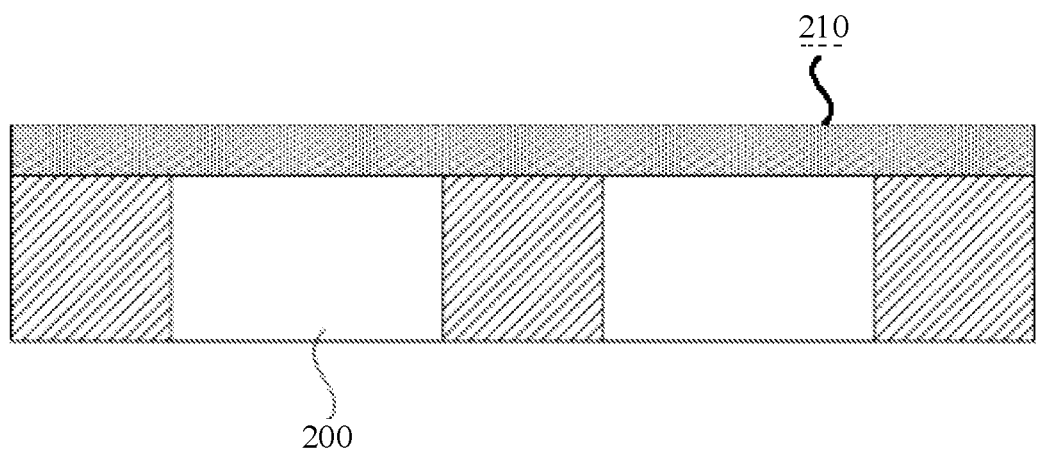
FIG. 3 is a second process flow diagram of an embodiment of a method for preparing a semiconductor structure according to an embodiment of the present disclosure.

Referring to S11 and FIG. 3, a semiconductor conductive layer 210 is formed on the semiconductor substrate 200. In the embodiment of the present disclosure, the semiconductor conductive layer 210 is polysilicon. In this operation, the semiconductor conductive layer 210 may be formed by using a Chemical Vapor Deposition (CVD) process.

Figure 4:
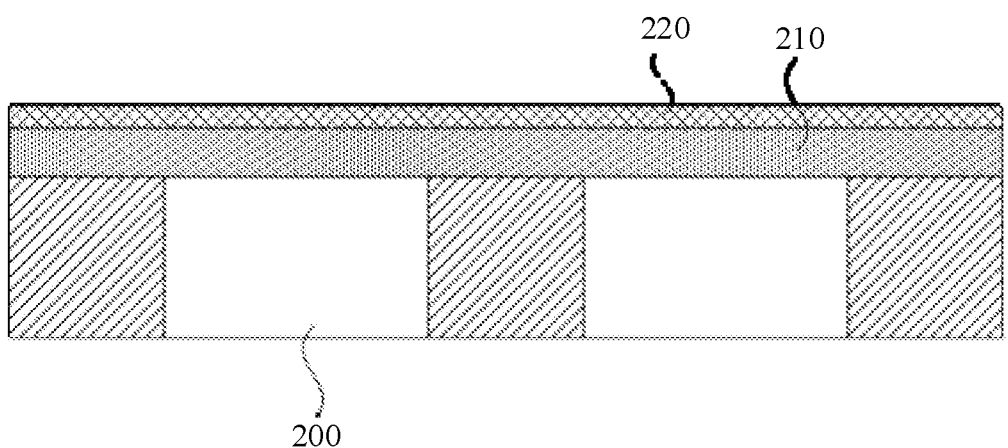
FIG. 4 is a third process flow diagram of an embodiment of a method for preparing a semiconductor structure according to an embodiment of the present disclosure.

Referring to S12 and FIG. 4, a nitrile or isonitrile transition layer 220 is formed on the semiconductor conductive layer 210. In the embodiment of the present disclosure, a method for forming the nitrile or isonitrile transition layer 220 on the semiconductor conductive layer 210 is that a surface of the semiconductor conductive layer 210 is treated with a nitrile or isonitrile organic solution to form the nitrile or isonitrile transition layer 220. For example, the semiconductor structure is immersed in the nitrile or isonitrile organic solution, and an immersing time may be 5-10 minutes.

Nitrile is an organic substance containing an organic group (—CN), with a general formula R—CN. In the embodiment of the present disclosure, R may be a saturated aliphatic hydrocarbon, an olefin, an aromatic hydrocarbon, a heterocyclic aromatic hydrocarbon, or the like. Isonitrile is an organic compound containing an isocyano group (—NC), with a general formula R—NC. R may be a saturated aliphatic hydrocarbon, an olefin, an aromatic hydrocarbon, a heterocyclic aromatic hydrocarbon, or the like. The nitrile or isonitrile organic solution may be a xylene solution of the nitrile or isonitrile. In some embodiments, the volume concentration of the nitrile or isonitrile in the nitrile or isonitrile organic solution may be 5%-10%.

The nitrile or isonitrile molecules in the nitrile or isonitrile organic solution will be bound to the surface of the semiconductor conductive layer 210, thereby forming a dense layer of nitrile or isonitrile molecules on the surface of the semiconductor conductive layer 210. For example, referring to FIG. 6, in the embodiment of the present disclosure, the semiconductor conductive layer 210 is a polysilicon layer. The semiconductor structure is immersed in a benzonitrile organic solution. C atom in the —CN group of benzonitrile will be bonded to silicon on the surface of the semiconductor conductive layer to form a C—Si bond, thereby forming a dense layer of benzonitrile on the surface of the semiconductor conductive layer 210.

After S12, the method further includes a rinsing operation. For example, in the embodiment of the present disclosure, the semiconductor structure is rinsed with ethane to remove the excess nitrile or isonitrile organic solution.

Figure 5:
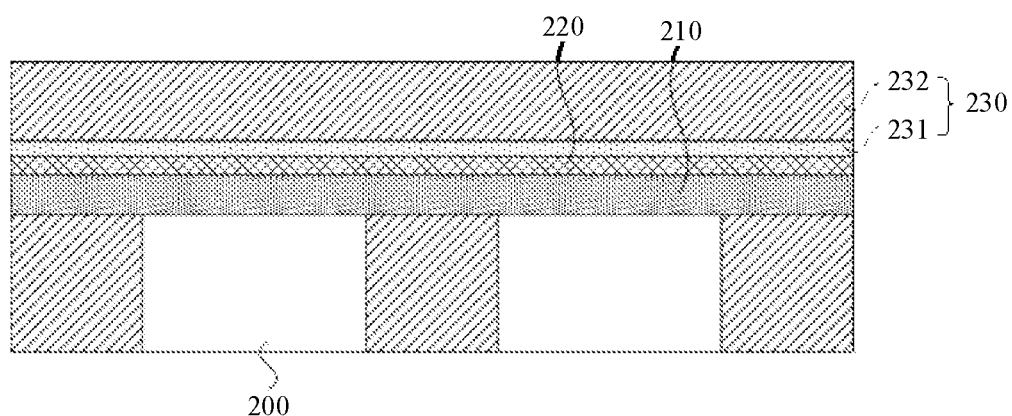
FIG. 5 is a fourth process flow diagram of an embodiment of a method for preparing a semiconductor structure according to an embodiment of the present disclosure.
Figure 6:
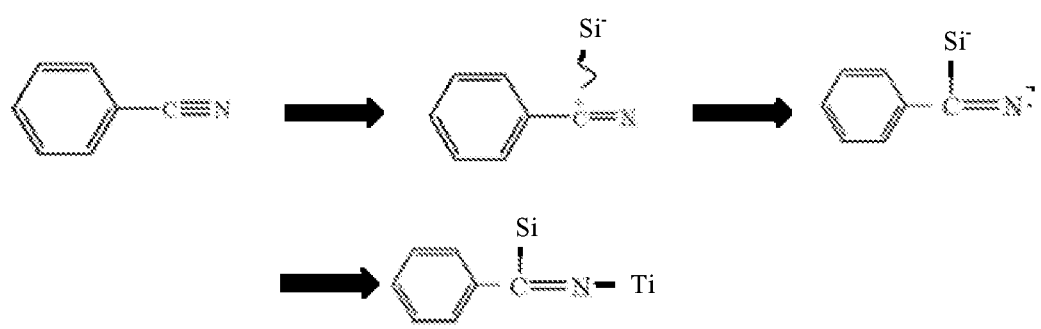
FIG. 6 is a fifth process flow diagram of an embodiment of a method for preparing a semiconductor structure according to an embodiment of the present disclosure.

Referring to S13 and FIG. 5, a metal conductive layer 230 is formed on the nitrile or isonitrile transition layer 220. The metal conductive layer 230 includes a barrier layer 231 and a metal layer 232. The barrier layer 231 may be a titanium (Ti) and titanium nitride (TiN) composite layer. The metal layer 232 may be a metal tungsten layer. In S13, the barrier layer 231 and the metal layer 232 may be formed by using processes such as an Atomic layer deposition (ALD) process, and a Low Pressure Chemical Vapor Deposition (LPCVD) process. In the embodiment of the present disclosure, after the Ti and TiN composite layer is formed and before the metal tungsten layer is formed, the method further includes a Rapid thermal processing (RTP) operation, so as to enhance the bonding between the semiconductor conductive layer 210 and the nitrile or isonitrile transition layer 220, and between the nitrile or isonitrile transition layer 220 and the barrier layer 231.

In the above rapid thermal processing operation, the nitrile or isonitrile transition layer 220 is bound to the metal conductive layer 230. The nitrile or isonitrile transition layer 220 serves as an intermediate layer, and is chemically bonded to the semiconductor conductive layer 210 and the metal conductive layer 230 respectively, so as to form a three-dimensional mesh conductive path. Charge movement in the conductive path mainly occurs in an axial direction of the molecular backbone of the nitrile or isonitrile transition layer 220, so that the charge mobility is improved, the contact resistance between the semiconductor conductive layer 210 and the metal conductive layer 230 is reduced, and the conductivity of the conductive structure is improved. For example, continuing to refer to FIG. 6, in the embodiment of the present disclosure, the barrier layer 231 is a Ti and TiN composite layer. When the barrier layer 231 is formed on the benzonitrile transition layer, Ti atoms in the barrier layer 231 are bound to N atoms in the benzonitrile transition layer, and the benzonitrile transition layer serves as an intermediate layer, so that the contact resistance between the polysilicon layer and the barrier layer 231 is reduced.

Figure 7:
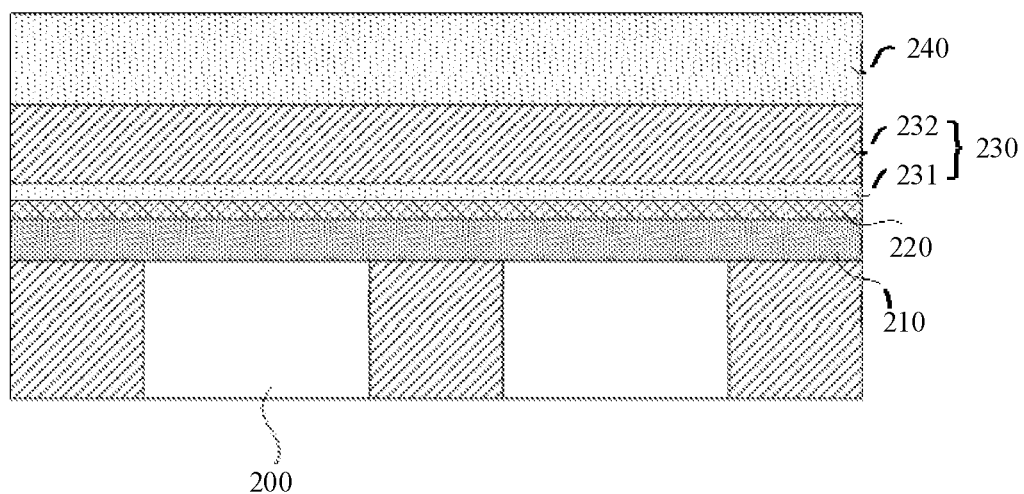
FIG. 7 is a sixth process flow diagram of an embodiment of a method for preparing a semiconductor structure according to an embodiment of the present disclosure.

Referring to S14 and FIG. 7, a passivation layer 240 is formed on the metal conductive layer 230. In the embodiment of the present disclosure, a silicon nitride layer is formed on the surface of the metal conductive layer 230 by using the chemical vapor deposition process as the passivation layer 240, so as to isolate the metal conductive layer 230 from the outside.

Figure 8:
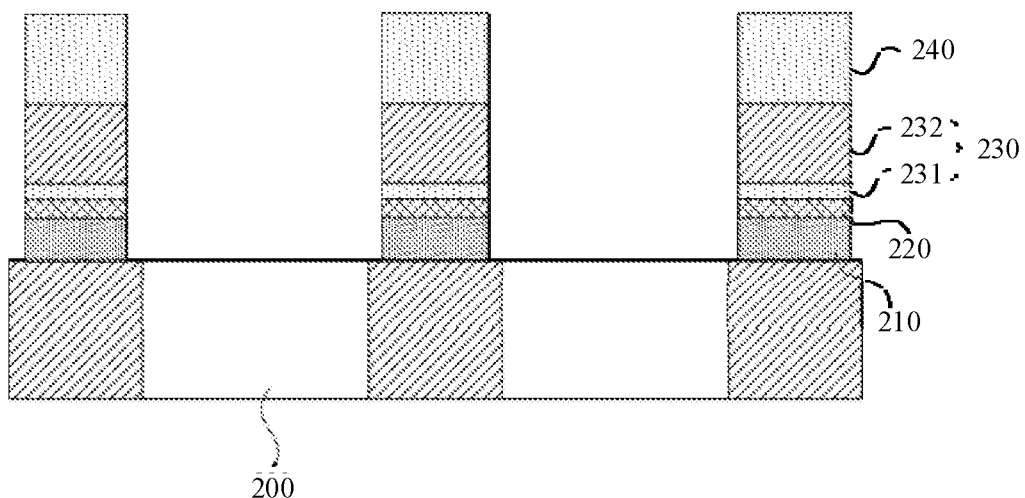
FIG. 8 is a seventh process flow diagram of an embodiment of a method for preparing a semiconductor structure according to an embodiment of the present disclosure.

Referring to S15 and FIG. 8, the passivation layer 240, the metal conductive layer 230, the nitrile or isonitrile transition layer 220 and the semiconductor conductive layer 210 are patterned to form a plurality of bit line structures discretely arranged on the semiconductor substrate 200. In other embodiments, S15 may not be executed.

In S15, the patterning may be carried out by using photolithography and etching processes. For example, a patterned photoresist layer may be formed on an upper surface of the passivation layer 240. The passivation layer 240, the metal conductive layer 230, the nitrile or isonitrile transition layer 220 and the semiconductor conductive layer 210 are etched by using the photoresist layer as a mask, so as to form a plurality of bit line structures discretely arranged on the semiconductor substrate 200. Each bit line structure may be in electrical contact with a bit line contact island in the semiconductor substrate.

Figure 9:
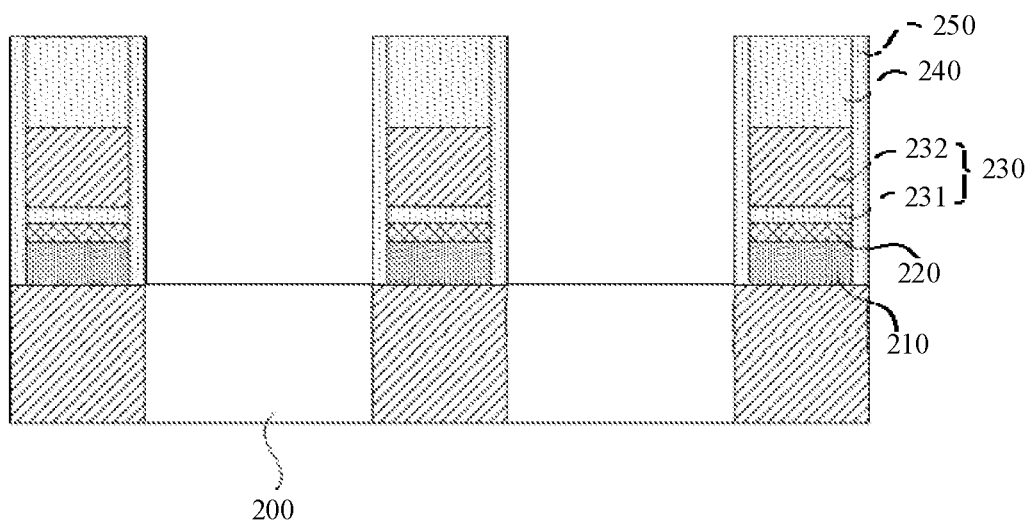
FIG. 9 is an eighth process flow diagram of an embodiment of a method for preparing a semiconductor structure according to an embodiment of the present disclosure.

In some embodiments, after S15, referring to FIG. 9, a protective layer 250 is formed on a sidewall of each bit line structure. The protection layer 250 is configured to protect a side surface of each bit line structure, so as to prevent the side surface of each bit line structure from being corroded, oxidized or damaged in subsequent processes. In the embodiment of the present disclosure, the protective layer 250 and the passivation layer 240 may be layers made of the same material, for example, both of them are silicon nitride layers. In other embodiments, the protective layer 250 may be a composite layer of nitride and oxide.

In the embodiment of the present disclosure, the conductive structure in each bit line structure includes the semiconductor conductive layer 210, the nitrile or isonitrile transition layer 220 and the metal conductive layer 230. The semiconductor conductive layer 210 and the metal conductive layer 230 are connected to each other through the nitrile or isonitrile transition layer 220. Compared with the direct contact between the semiconductor conductive layer 210 and the metal conductive layer 230 in the related art, the resistance between the semiconductor conductive layer 210 and the metal conductive layer 230 is reduced, and the conductivity of the conductive structure is improved.

Figure 10:
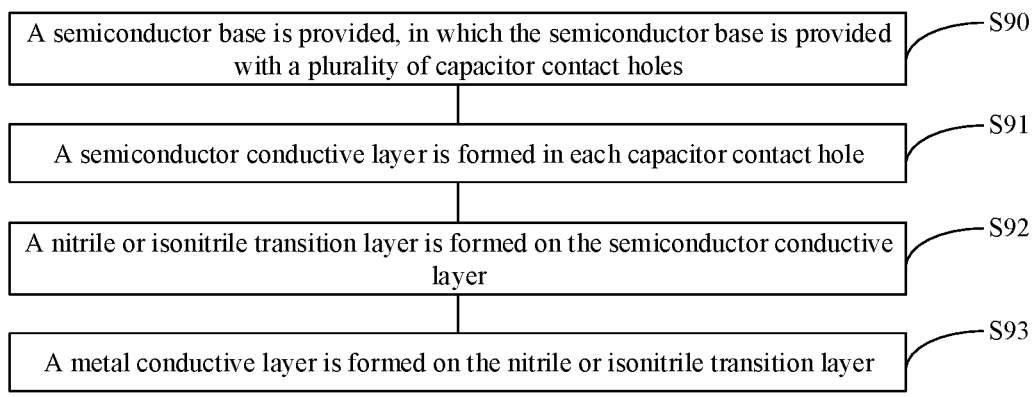
FIG. 10 is a schematic diagram of operations of another embodiment of a method for preparing a semiconductor structure according to an embodiment of the present disclosure.

A method for preparing a semiconductor structure of an embodiment of the present disclosure further provides another embodiment. FIG. 10 is a schematic diagram of operations of another embodiment of a method for preparing a semiconductor structure according to an embodiment of the present disclosure. Referring to the FIG. 10, the method includes the following operations. In S90, a semiconductor base is provided, which is provided with a plurality of capacitor contact holes. In S91, the semiconductor conductive layer is formed in each capacitor contact hole. In S92, a nitrile or isonitrile transition layer is formed on the semiconductor conductive layer. In S93, a metal conductive layer is formed on the nitrile or isonitrile transition layer.

FIGS. 11-15 are process flow charts of another embodiment of a method for preparing a semiconductor structure according to an embodiment of the present disclosure.

Figure 11:
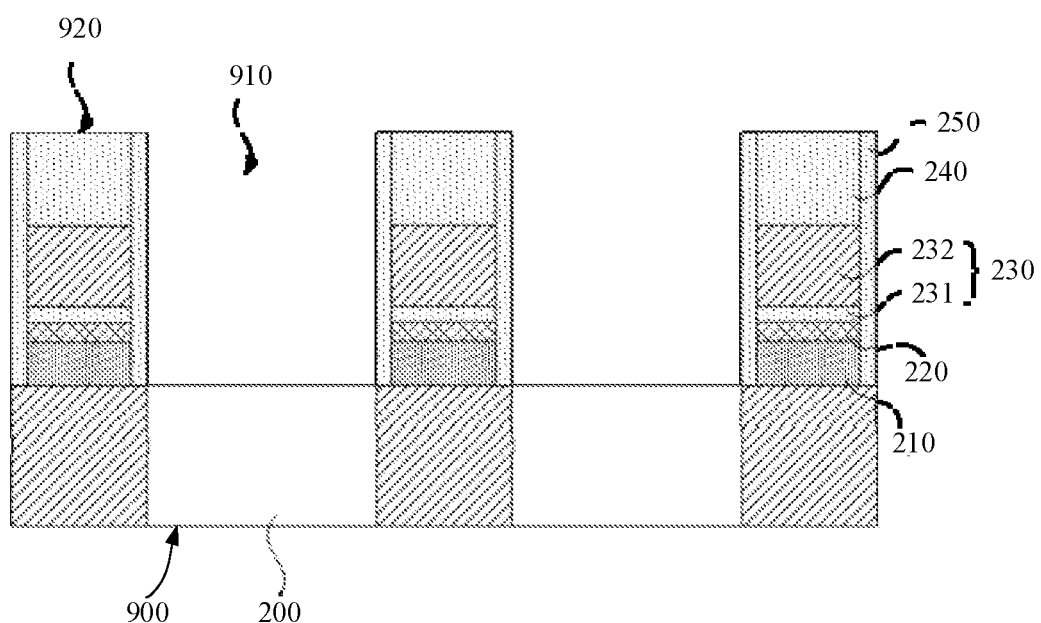
FIG. 11 is a first process flow diagram of another embodiment of a method for preparing a semiconductor structure according to an embodiment of the present disclosure.
Figure 12:
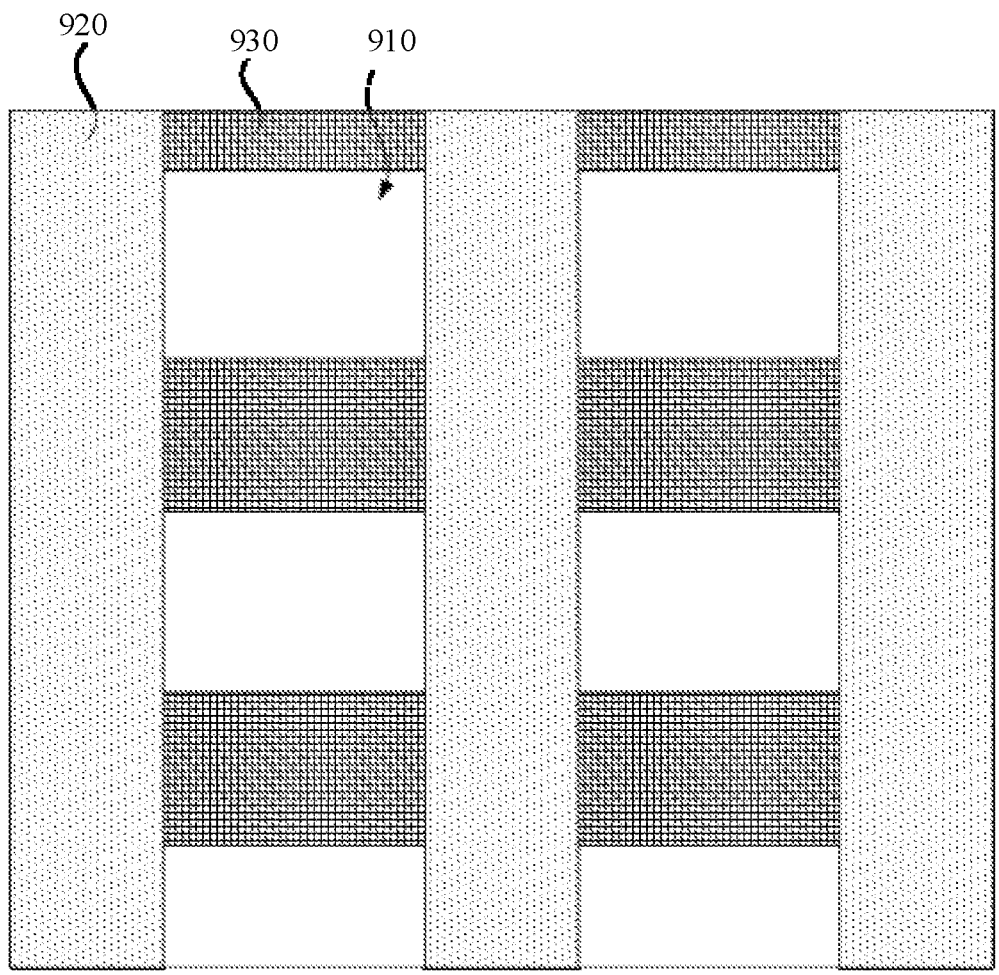
FIG. 12 is a second process flow diagram of another embodiment of a method for preparing a semiconductor structure according to an embodiment of the present disclosure.

Referring to S90, FIG. 11 and FIG. 12, FIG. 12 is a top view of a structure shown in FIG. 11. A semiconductor base 900 is provided. The semiconductor base 900 is provided with a plurality of capacitor contact holes 910.

In the embodiment of the present disclosure, the semiconductor base 900 includes a semiconductor substrate 200 and a plurality of bit line structures 920 arranged on the semiconductor substrate 200. A plurality of isolation structures 930 are arranged along a direction perpendicular to the bit line structures. The isolation structures 930 and the bit line structures 920 form a plurality of capacitor contact holes 910.

The bit line structures 920 described in the embodiment of the present disclosure are the same as the bit line structures formed in the foregoing embodiment, and the details will not be repeated herein. In other embodiments, the bit line structures 920 may also be different from the bit line structures in the foregoing embodiment. For example, in other embodiments, the conductive structure of each bit line structure 920 includes a semiconductor conductive layer 210 and a metal conductive layer 230, but does not include a nitrile or isonitrile transition layer 220.

Figure 13:
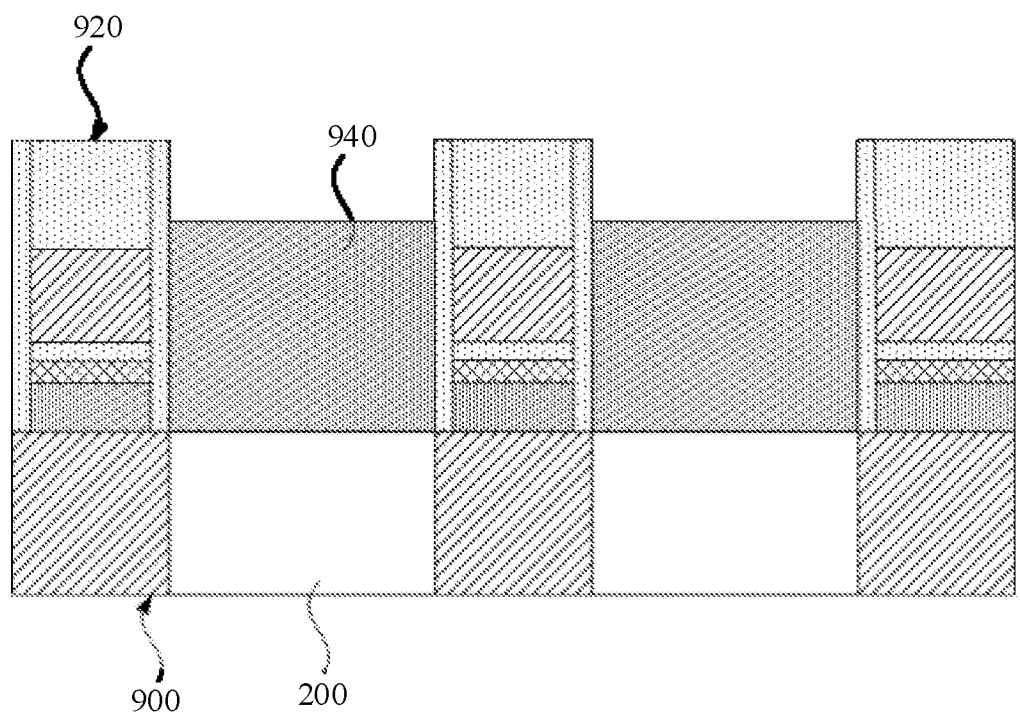
FIG. 13 is a third process flow diagram of another embodiment of a method for preparing a semiconductor structure according to an embodiment of the present disclosure.

Referring to S91 and FIG. 13, a semiconductor conductive layer 940 is formed in each capacitor contact hole 910. The semiconductor conductive layer 940 is a polysilicon layer, and the semiconductor conductive layer 940 is electrically connected to an active area of the semiconductor substrate 200. In S91, the semiconductor conductive layer 940 may be formed by using a CVD process. For example, the method for forming the semiconductor conductive layer 940 in each capacitor contact hole 910 may include the following operations. A semiconductor conductive material is deposited in each capacitor contact hole 910 and on a surface of each bit line structure 920. The semiconductor conductive material is etched back to form the semiconductor conductive layer 940 at the bottom of each capacitor contact hole 910.

Figure 14:
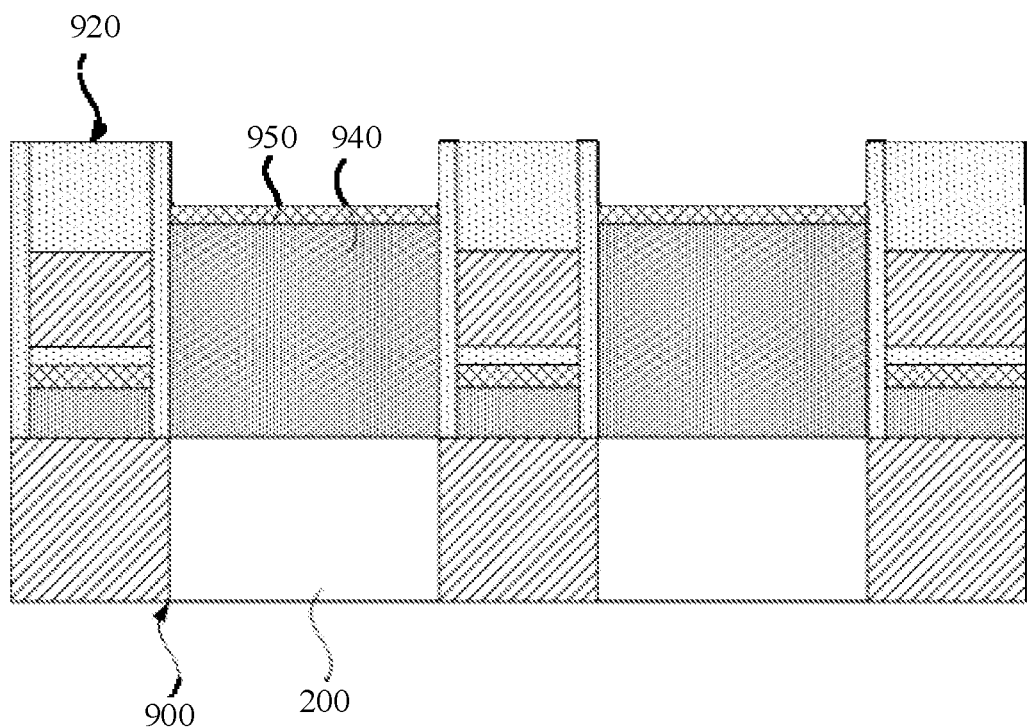
FIG. 14 is a fourth process flow diagram of another embodiment of a method for preparing a semiconductor structure according to an embodiment of the present disclosure.

Referring to S92 and FIG. 14, a nitrile or isonitrile transition layer 950 is formed on the semiconductor conductive layer 940. In the embodiment of the present disclosure, a method for forming the nitrile or isonitrile transition layer 950 on the semiconductor conductive layer 940 may include the following operation. A surface of the semiconductor conductive layer 940 is treated with a nitrile or isonitrile organic solution to form the nitrile or isonitrile transition layer 950. For example, the semiconductor structure is immersed in the nitrile or isonitrile organic solution, and an immersing time may be 5-10 minutes.

Nitrile is an organic substance containing an organic group (—CN), with a general formula R—CN. In the embodiment of the present disclosure, R may be a saturated aliphatic hydrocarbon, an olefin, an aromatic hydrocarbon, a heterocyclic aromatic hydrocarbon, or the like. Isonitrile is an organic compound containing an isocyano group (—NC), with a general formula R—NC. R may be a saturated aliphatic hydrocarbon, an olefin, an aromatic hydrocarbon, a heterocyclic aromatic hydrocarbon, or the like. The nitrile or isonitrile organic solution may be a xylene solution of the nitrile or isonitrile. In some embodiments, the volume concentration of the nitrile or isonitrile in the nitrile or isonitrile organic solution may be 5%-10%.

The nitrile or isonitrile molecules in the nitrile or isonitrile organic solution will be bound to the surface of the semiconductor conductive layer 940, thereby forming a dense layer of nitrile or isonitrile molecules on the surface of the semiconductor conductive layer 940. For example, continuing to refer to FIG. 6, in the embodiment of the present disclosure, the semiconductor conductive layer 940 is a polysilicon layer. The semiconductor structure is immersed in a benzonitrile organic solution. C atom in the —CN group of benzonitrile will be bonded to silicon on the surface of the semiconductor conductive layer to form a C—Si bond, thereby forming a dense layer of benzonitrile on the surface of the semiconductor conductive layer 940.

After S92, the method further includes a rinsing operation. For example, in the embodiment of the present disclosure, the semiconductor structure is rinsed with ethane to remove the excess nitrile or isonitrile organic solution.

Figure 15:
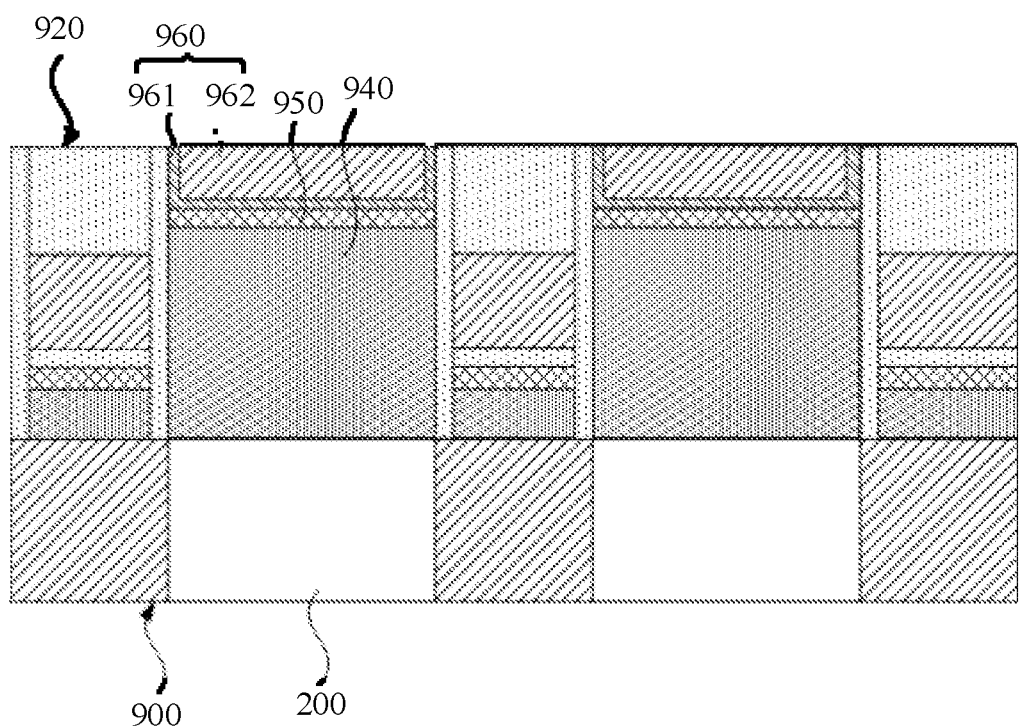
FIG. 15 is a fifth process flow diagram of another embodiment of a method for preparing a semiconductor structure according to an embodiment of the present disclosure.

Referring to S93 and FIG. 15, a metal conductive layer 960 is formed on the nitrile or isonitrile transition layer 950. The metal conductive layer 960 includes a barrier layer 961 and a metal layer 962. The barrier layer 961 may be a Ti and TiN composite layer. The metal layer 962 may be a metal tungsten layer. In S93, the barrier layer 961 and the metal layer 962 may be formed by using processes such as ALD process and LPCVD process. In some embodiments, after the Ti and TiN composite layer is formed and before the metal tungsten layer is formed, the method further includes a RTP operation, so as to enhance the bonding between the semiconductor conductive layer 940 and the nitrile or isonitrile transition layer 950, and between the nitrile or isonitrile transition layer 950 and the barrier layer 961.

In S93, the barrier layer 961 covers an exposed sidewall of each capacitor contact hole 910 and a surface of the nitrile or isonitrile transition layer 950, and the metal layer 962 fills each capacitor contact hole 910.

The nitrile or isonitrile transition layer 950 is bound to the metal conductive layer 960. The nitrile or isonitrile transition layer 950 serves as an intermediate layer, and is chemically bonded to the semiconductor conductive layer 940 and the metal conductive layer 960 respectively, so as to form a three-dimensional mesh conductive path. Charge movement in the conductive path mainly occurs in an axial direction of the molecular backbone of the nitrile or isonitrile transition layer 950, so that the charge mobility is improved, the contact resistance between the semiconductor conductive layer 940 and the metal conductive layer 960 is reduced, and the conductivity of the conductive structure is improved. For example, continuing to refer to FIG. 6, in the embodiment of the present disclosure, the barrier layer 961 is a Ti and TiN composite layer. When the barrier layer 961 is formed on the benzonitrile transition layer, Ti atoms in the barrier layer 961 are bound to N atoms in the benzonitrile transition layer, and the benzonitrile transition layer serves as an intermediate layer, so that the contact resistance between the polysilicon layer and the barrier layer 961 is reduced.

In some embodiments, after the operation that the metal conductive layer 960 is formed, a protective layer may further be formed on the surface of the semiconductor structure. The protective layer covers the surface of each bit line structure 920, the surface of each isolation structure 930 and the surface of the metal conductive layer 960. The protective layer includes, but is not limited to, a silicon nitride layer.

In the embodiment of the present disclosure, the conductive structure formed in each capacitor contact hole includes the semiconductor conductive layer 940, the nitrile or isonitrile transition layer 950 and the metal conductive layer 960. The semiconductor conductive layer 940 and the metal conductive layer 960 are connected to each other through the nitrile or isonitrile transition layer 950. Compared with the direct contact between the semiconductor conductive layer and the metal conductive layer in the related art, the resistance between the semiconductor conductive layer and the metal conductive layer is reduced, and the conductivity of the conductive structure is improved.

An embodiment of the present disclosure further provides a semiconductor structure formed by using the method described above.

In an embodiment of the semiconductor structure according to an embodiment of the present disclosure, referring to FIG. 9, the semiconductor structure includes a semiconductor base. The semiconductor base includes a semiconductor substrate 200 and a plurality of bit line structures discretely arranged on the semiconductor substrate 200.

The semiconductor substrate 200 may be at least one of the following materials: Si, Ge, SiGe, SiC, SiGeC, InAs, GaAs, InP or other III/V compound semiconductors, and further includes a multilayer structure composed of these semiconductors, or may be a SOI, a S—SOI, a S—SiGeOI, a SiGeOI, a GeOI and the like. As an example, in the embodiment of the present disclosure, the material of the semiconductor substrate 200 is single crystal silicon.

Each bit line structure includes a conductive structure and a passivation layer 240 covering the conductive structure. The conductive structure includes a semiconductor conductive layer 210, a nitrile or isonitrile transition layer 220 and a metal conductive layer 230. The semiconductor conductive layer 210 is arranged on a surface of the semiconductor substrate 200. The semiconductor conductive layer 210 includes, but is not limited to, a polysilicon layer. The nitrile or isonitrile transition layer 220 is formed by treating the surface of the semiconductor conductive layer 210 with a nitrile or isonitrile organic solution. The metal conductive layer 230 includes a barrier layer 231 and a metal layer 232. The barrier layer 231 may be a Ti and TiN composite layer. The metal layer 232 may be a metal tungsten layer. In the conductive structure, the semiconductor conductive layer 210 and the metal conductive layer 230 are connected to each other through the nitrile or isonitrile transition layer 220. Compared with the direct contact between the semiconductor conductive layer and the metal conductive layer in the related art, the resistance between the semiconductor conductive layer 210 and the metal conductive layer 230 is reduced, and the conductivity of the conductive structure is improved.

The passivation layer 240 covers the metal conductive layer 230. The passivation layer 240 may be a silicon nitride layer. In the embodiment of the present disclosure, a protective layer 250 is formed on a side surface of each bit line structure. The protection layer 250 is configured to protect the side surface of each bit line structure, so as to prevent the side surface of each bit line structure from being corroded, oxidized or damaged in subsequent processes. In the embodiment of the present disclosure, the protective layer 250 and the passivation layer 240 may be layers made of the same material, for example, both of them are silicon nitride layers.

An embodiment of the present disclosure further provides another embodiment of a semiconductor structure. Referring to FIG. 15 and FIG. 12, the semiconductor structure includes a semiconductor base 900. The semiconductor base includes a semiconductor substrate 200 and a plurality of bit line structures 920 discretely arranged on the semiconductor substrate 200. A plurality of isolation structures 930 are arranged along a direction perpendicular to the bit line structures. The isolation structures 930 and the bit line structures 920 form a plurality of capacitor contact holes 910.

In the embodiment of the present disclosure, the bit line structures 920 are the same as the bit line structures formed in the foregoing embodiment, and the details will not be repeated herein. In other embodiments, the bit line structures 920 may also be different from the bit line structures in the foregoing embodiment. For example, in other embodiments, the conductive structure of each bit line structure 920 includes a semiconductor conductive layer 210 and a metal conductive layer 230, but does not include a nitrile or isonitrile transition layer 220.

Each of the capacitor contact holes 910 is provided with the conductive structure. The conductive structure includes a semiconductor conductive layer 940, a nitrile or isonitrile transition layer 950 and a metal conductive layer 960 which are sequentially stacked on one another. The semiconductor conductive layer 940 is arranged on a surface of the semiconductor substrate 200, and is electrically connected to an active area of the semiconductor substrate 200. The nitrile or isonitrile transition layer 950 is formed by treating the surface of the semiconductor conductive layer 940 with a nitrile or isonitrile organic solution. The metal conductive layer 960 includes a barrier layer 961 and a metal layer 962. The barrier layer 961 may be a Ti and TiN composite layer. The metal layer 962 may be a metal tungsten layer. In the conductive structure, the semiconductor conductive layer 940 and the metal conductive layer 960 are connected to each other through the nitrile or isonitrile transition layer 950. Compared with the direct contact between the semiconductor conductive layer and the metal conductive layer in the related art, the resistance between the semiconductor conductive layer 940 and the metal conductive layer 960 is reduced, and the conductivity of the conductive structure is improved.

In some embodiments, the surface of each bit line structure 920, the surface of each isolation structure 930 and the surface of the metal conductive layer 960 are also covered with a passivation layer (not shown in the figures), so as to protect the bit line structures 920 and the metal conductive layer 960.

The foregoing descriptions are merely some implementations of the embodiments of the present disclosure. It should be pointed out that a person of ordinary skill in the art may make several improvements and refinements without departing from the principle of the present disclosure, and the improvements and refinements shall fall within the protection scope of the present disclosure.

What is claimed is:

1. A method for preparing a semiconductor structure, the semiconductor structure comprising a conductive structure, the method for preparing the conductive structure comprising the following operations:
   forming a semiconductor conductive layer;
   forming a nitrile or isonitrile transition layer on the semiconductor conductive layer; and
   forming a metal conductive layer on the nitrile or isonitrile transition layer.

2. The method for preparing the semiconductor structure according to claim 1, wherein the method, after forming the metal conductive layer on the nitrile or isonitrile transition layer, further comprises:
   forming a passivation layer on the metal conductive layer.

3. The method for preparing the semiconductor structure according to claim 2, wherein the semiconductor conductive layer is formed on a semiconductor substrate, and the method, after forming the passivation layer on the metal conductive layer, further comprises:
   patterning the passivation layer, the metal conductive layer, the nitrile or isonitrile transition layer and the semiconductor conductive layer to form a plurality of bit line structures discretely arranged on the semiconductor substrate.

4. The method for preparing the semiconductor structure according to claim 3, wherein the method further comprises:
   forming a protective layer on a sidewall of each bit line structure.

5. The method for preparing the semiconductor structure according to claim 1, wherein forming the semiconductor conductive layer comprises:
   providing a semiconductor base provided with a plurality of capacitor contact holes; and
   forming the semiconductor conductive layer in each capacitor contact hole.

6. The method for preparing the semiconductor structure according to claim 1, wherein forming the nitrile or isonitrile transition layer on the semiconductor conductive layer comprises:
   treating a surface of the semiconductor conductive layer with a nitrile or isonitrile organic solution to form the nitrile or isonitrile transition layer.

7. The method for preparing the semiconductor structure according to claim 2, wherein forming the nitrile or isonitrile transition layer on the semiconductor conductive layer comprises:

treating a surface of the semiconductor conductive layer with a nitrile or isonitrile organic solution to form the nitrile or isonitrile transition layer.

8. The method for preparing the semiconductor structure according to claim 3, wherein forming the nitrile or isonitrile transition layer on the semiconductor conductive layer comprises:
   treating a surface of the semiconductor conductive layer with a nitrile or isonitrile organic solution to form the nitrile or isonitrile transition layer.

9. The method for preparing the semiconductor structure according to claim 4, wherein forming the nitrile or isonitrile transition layer on the semiconductor conductive layer comprises:
   treating a surface of the semiconductor conductive layer with a nitrile or isonitrile organic solution to form the nitrile or isonitrile transition layer.

10. The method for preparing the semiconductor structure according to claim 5, wherein forming the nitrile or isonitrile transition layer on the semiconductor conductive layer comprises:
    treating a surface of the semiconductor conductive layer with a nitrile or isonitrile organic solution to form the nitrile or isonitrile transition layer.

11. The method for preparing the semiconductor structure according to claim 6, wherein a concentration of nitrile or isonitrile in the nitrile or isonitrile organic solution is 5%-10%.

12. The method for preparing the semiconductor structure according to claim 6, wherein the method, after forming the nitrile or isonitrile transition layer on the semiconductor conductive layer, further comprises a rinsing operation.

13. The method for preparing the semiconductor structure according to claim 1, wherein the semiconductor conductive layer is a polysilicon layer, and the metal conductive layer comprises a Ti and TiN composite layer and a metal tungsten layer which are sequentially formed.

14. The method for preparing the semiconductor structure according to claim 2, wherein the semiconductor conductive layer is a polysilicon layer, and the metal conductive layer comprises a Ti and TiN composite layer and a metal tungsten layer which are sequentially formed.

15. The method for preparing the semiconductor structure according to claim 13, wherein the method, after forming the Ti and TiN composite layer and before forming the metal tungsten layer, further comprises a rapid thermal processing operation.

16. A semiconductor structure prepared with the method of claim 1, comprising the conductive structure comprising the semiconductor conductive layer, the nitrile or isonitrile transition layer and the metal conductive layer which are sequentially stacked on one another.

17. The semiconductor structure according to claim 16, wherein the semiconductor structure further comprises a semiconductor base, the semiconductor base comprises a semiconductor substrate and a plurality of bit line structures discretely arranged on the semiconductor substrate, a plurality of isolation structures are arranged along a direction perpendicular to the bit line structures, and the isolation structures and the bit line structures form a plurality of capacitor contact holes.

18. The semiconductor structure according to claim 17, wherein each bit line structure comprises the conductive structure and a passivation layer covering the conductive structure.

19. The semiconductor structure according to claim 17, wherein a protective layer is formed on a sidewall of each bit line structure.

20. The semiconductor structure according to claim 17, wherein the conductive structure is provided in each of the capacitor contact holes.

* * * * *